(12) United States Patent
Jin et al.

(10) Patent No.: US 9,806,136 B2
(45) Date of Patent: *Oct. 31, 2017

(54) ORGANIC LIGHT EMITTING DIODE DISPLAY DEVICE AND METHOD FOR REPAIRING ORGANIC LIGHT EMITTING DIODE DISPLAY

(71) Applicant: SAMSUNG DISPLAY CO., LTD., Yongin-si, Gyeonggi-do (KR)

(72) Inventors: Guang hai Jin, Yongin-si (KR); Jae-Beom Choi, Yongin-si (KR); Kwan-Wook Jung, Yongin-si (KR); June-Woo Lee, Yongin-si (KR); Moo-Jin Kim, Yongin-si (KR); Na-Young Kim, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/222,714

(22) Filed: Jul. 28, 2016

(65) Prior Publication Data

US 2016/0336384 A1    Nov. 17, 2016

Related U.S. Application Data

(63) Continuation of application No. 13/611,901, filed on Sep. 12, 2012, now Pat. No. 9,406,729.

(30) Foreign Application Priority Data

Mar. 30, 2012    (KR) .................. 10-2012-0033395

(51) Int. Cl.
  *H01L 51/00*    (2006.01)
  *H01L 27/32*    (2006.01)
  *H01L 51/52*    (2006.01)

(52) U.S. Cl.
  CPC ...... *H01L 27/3248* (2013.01); *H01L 27/3244* (2013.01); *H01L 27/3258* (2013.01);
  (Continued)

(58) Field of Classification Search
  None
  See application file for complete search history.

(56) References Cited

U.S. PATENT DOCUMENTS 7,234,984 B2    6/2007    Nishikiwa et al.
7,750,561 B2    7/2010    Aziz et al.
(Continued)

FOREIGN PATENT DOCUMENTS

JP    2006-330469 A    12/2006
JP    2010-002676 A    1/2010
(Continued)

*Primary Examiner* — Benjamin Sandvik
(74) *Attorney, Agent, or Firm* — Lee & Morse P.C.

(57)    ABSTRACT

An organic light emitting diode (OLED) display includes a light-emitting region including an organic emission layer and a non-light-emitting region neighboring the light-emitting region. The OLED display includes a first electrode positioned at the light-emitting region and including a plurality of division regions divided according to a virtual cutting line crossing the light-emitting region, an organic emission layer positioned on the first electrode, a second electrode positioned on the organic emission layer, a driving thin film transistor connected to the first electrode, and a plurality of input terminals positioned at the non-light-emitting region and respectively connecting between each of division regions and the driving thin film transistor.

11 Claims, 7 Drawing Sheets

(52) U.S. Cl.
CPC ...... *H01L 27/3276* (2013.01); *H01L 51/5203* (2013.01); *H01L 2227/323* (2013.01); *H01L 2251/568* (2013.01)

(56) References Cited

U.S. PATENT DOCUMENTS

| | | | |
|---|---|---|---|
| 8,450,926 B2 | | 5/2013 | Roberts et al. |
| 9,406,729 B2 | * | 8/2016 | Jin ..................... H01L 27/3244 |
| 2006/0290277 A1 | | 12/2006 | Takahashi et al. |
| 2007/0046186 A1 | | 3/2007 | Kim |
| 2010/0044691 A1 | | 2/2010 | Hong et al. |
| 2010/0065845 A1 | | 3/2010 | Nakayama |
| 2010/0164375 A1 | | 7/2010 | Kajiyama |
| 2012/0032175 A1 | | 2/2012 | Wang et al. |
| 2012/0099047 A1 | | 4/2012 | Lee |
| 2012/0138966 A1 | | 6/2012 | Shin |
| 2013/0069067 A1 | | 3/2013 | Youn |

FOREIGN PATENT DOCUMENTS

| | | |
|---|---|---|
| KR | 10-2007-0024810 A | 3/2007 |
| KR | 10-2011-0122513 A | 11/2011 |

\* cited by examiner

ORGANIC LIGHT EMITTING DIODE DISPLAY DEVICE AND METHOD FOR REPAIRING ORGANIC LIGHT EMITTING DIODE DISPLAY

CROSS-REFERENCE TO RELATED APPLICATIONS

This is a continuation application based on pending application Ser. No. 13/611,901, filed Sep. 12, 2012, the entire contents of which is hereby incorporated by reference.

This application claims priority to and the benefit of Korean Patent Application No. 10-2012-0033395 filed in the Korean Intellectual Property Office on Mar. 30, 2012, the entire contents of which are incorporated herein by reference.

BACKGROUND

1. Field

The present invention relates an organic light emitting diode (OLED) display and a method for repairing an organic light emitting diode (OLED) display. More particularly, the described technology relates generally to an organic light emitting diode (OLED) display and a method for easily repairing an organic light emitting diode (OLED) display.

2. Description of the Related Art

A display device is a device that displays an image. Recently, organic light emitting diode displays have been drawing attention. An organic light emitting diode display has a self-luminous characteristic and may have a relatively small thickness and weight, since, unlike a liquid crystal display, it does not need a separate light source. In addition, the organic light emitting diode display exhibits high-quality characteristics such as low power consumption, high luminance, high response speed, etc.

SUMMARY

Embodiments are directed to an organic light emitting diode (OLED) display including a light-emitting region including an organic emission layer and a non-light-emitting region neighboring the light-emitting region, the OLED display including a first electrode positioned at the light-emitting region and including a plurality of division regions divided according to a virtual cutting line crossing the light-emitting region, an organic emission layer positioned on the first electrode, a second electrode positioned on the organic emission layer, a driving thin film transistor connected to the first electrode, and a plurality of input terminals positioned at the non-light-emitting region and respectively connecting between each of division regions and the driving thin film transistor.

The first electrode and the organic emission layer may be cut by a laser according to the virtual cutting line such that each division region includes a first electrode portion and an organic emission layer portion of the first electrode and the organic emission layer.

One first electrode portion corresponding to one division region among a plurality of division regions may be in a short-circuited state with the second electrode.

The plurality of input terminals and the first electrode may be one body.

The plurality of input terminals and the first electrode may be formed with different materials.

The second electrode may be a light reflective electrode.

The OLED display may further include a light transmission substrate, the first electrode being positioned at an upper side of the light transmission substrate.

The OLED display may further include a light transmission insulation layer positioned between the light transmission substrate and the first electrode such that only the light transmission insulation layer is between the light transmission substrate and the first electrode.

Embodiments are also directed to a method of repairing an OLED display, the method including providing an OLED display including a light-emitting region including an organic emission layer, a non-light-emitting region neighboring the light-emitting region, a first electrode positioned at the light-emitting region and including a plurality of division regions divided according to a virtual cutting line crossing the light-emitting region, an organic emission layer positioned on the first electrode, a second electrode positioned on the organic emission layer, a driving thin film transistor connected to the first electrode, and a plurality of input terminals positioned at the non-light-emitting region and respectively connecting between each of division regions and the driving thin film transistor, and cutting the first electrode and the organic emission layer according to the virtual cutting line using a laser.

The OLED display may include a light transmission substrate, the first electrode being positioned at an upper side of the light transmission substrate. The cutting of the first electrode and the organic emission layer may be performed by irradiating the laser to the substrate.

The laser may be an Nd:YAG UV laser and has a wavelength range of 30 nm to 200 nm.

The method may further include confirming the light emission of the organic emission layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
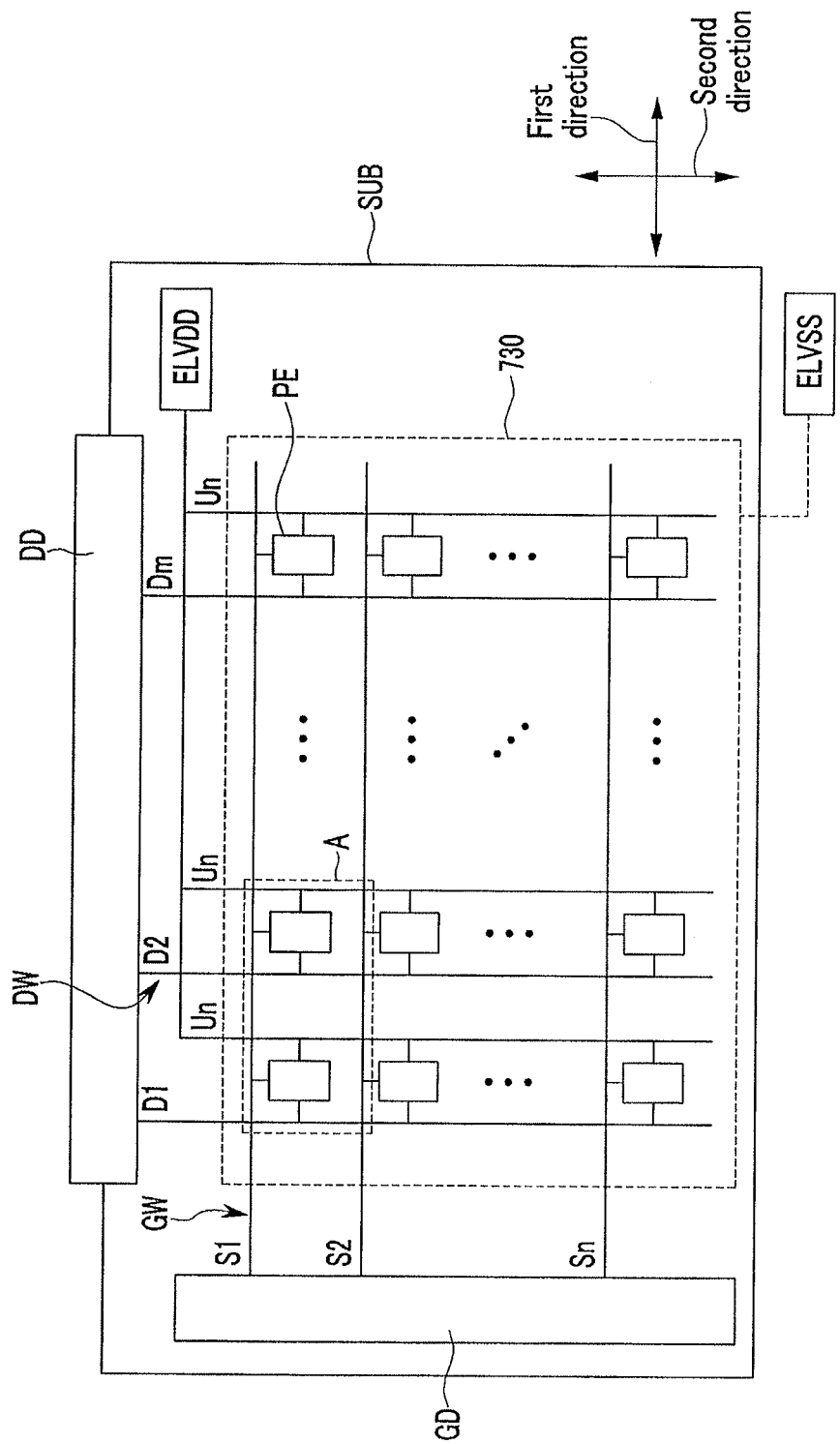
FIG. 1 illustrates a view of an organic light emitting diode (OLED) display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

For greater clarity, parts that are not relevant with the description may be omitted. The same elements or equivalents may be referred to by the same reference numerals throughout the specification.

The size and thickness of each element are arbitrarily shown in the drawings, and the thickness of layers, films, panels, regions, etc., may be exaggerated for clarity. Moreover, it is be understood that when an element such as a layer, film, region, or substrate is referred to as being "on" another element, such element may be directly on the other element, or intervening elements may also be present.

In addition, unless explicitly described to the contrary, the word "comprise" and variations such as "comprises" or "comprising" will be understood to imply the inclusion of stated elements but not the exclusion of any other elements. Also, throughout the specification, "on" means that an element is positioned on, above, under, or below another element, and may not necessarily mean that an element is positioned at an upper side of another element based on a gravity direction.

The attached drawings illustrate the active matrix (AM) display device having a 2Tr-1Cap structure in which a pixel has two thin film transistors (TFTs) and one capacitor. In other implementations, other structures are possible. For example, the OLED display may include at least three thin film transistors and at least two capacitors for each pixel, and may further include additional wiring for various configurations. Herein, the term "pixel" represents a minimum unit for displaying an image. An OLED display expresses the image through a plurality of pixels.

An OLED display according to an exemplary embodiment will be described with reference to FIG. 1 to FIG. 3.

FIG. 1 is a view of an OLED display according to the first exemplary embodiment.

As shown in FIG. 1, an OLED display according to the exemplary embodiment may include a substrate SUB, a gate driver GD, gate wires GW, a data driver DD, data wires DW, and a pixel PE. As noted above, the term "pixel PE" refers to a minimum unit displaying an image, and the OLED display displays the image through a plurality of pixels PE.

The substrate SUB may be a transparent light transmission substrate made of glass, quartz, ceramic, or plastic. If the substrate SUB is made of plastic, the OLED display may be flexible or may be rolled. In other implementations, the substrate SUB may be a metallic substrate made of stainless steel.

The gate driver GD may sequentially supply a scan signal to the gate wires GW corresponding to a control signal supplied by a control circuit (not shown), for example, a timing controller. The pixel PE may be selected by the scan signal to sequentially receive a data signal.

Figure 3:
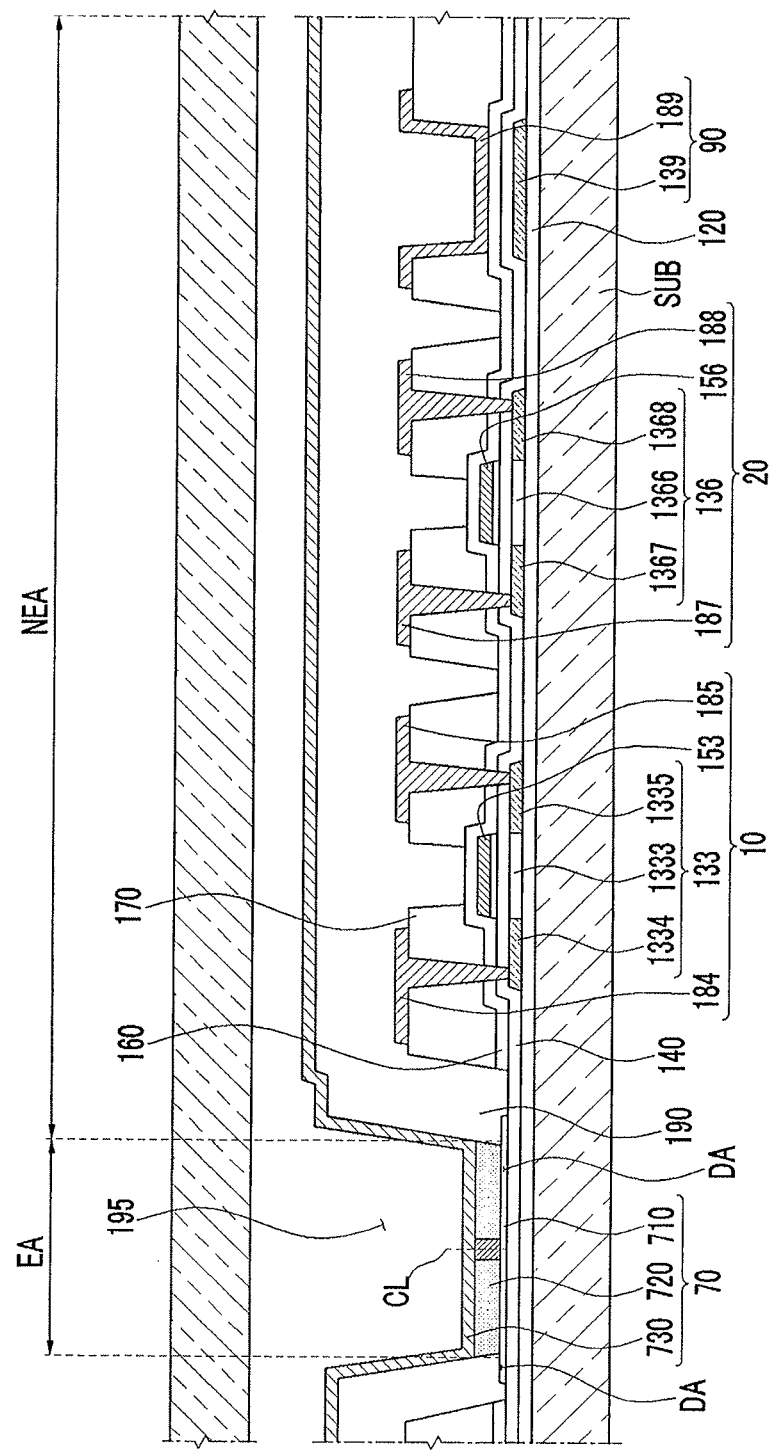
FIG. 3 illustrates a cross-sectional view taken along the line III-III of FIG. 2.

The gate wires GW may be provided on the substrate SUB with a first insulation layer 140 shown in FIG. 3, and may extend in a first direction. The gate wires GW may include scan lines S1-Sn that are connected to the gate driver GD to receive a scan signal from the gate driver GD.

The gate wires GW of the OLED display according to the exemplary embodiment may include the scan line Sn. The gate wires of an OLED display according to other implementations may further include an additional scan line, a reset power line, and an emission control line. For example, the OLED display may be an active matrix (AM) organic light emitting OLED display having a 6Tr-2Cap structure.

The data driver DD may supply a data signal to a data line Dm from among the data wires DW corresponding to a control signal supplied by the timing controller. The data signal supplied to the data line Dm may be supplied to the pixel PE selected by the scan signal each time the scan signal is supplied to the scan line Sn. The pixel PE may be charged with a voltage corresponding to the data signal and may emit light with a corresponding luminance.

The data wires DW may be provided on the gate wires GW with a second insulation layer 170 shown in FIG. 3 therebetween, and may extend in a second direction to cross the first direction. The data wires DW may include the data lines D1-Dm and a drive power line Un. The data line Dm may be connected to the data driver DD and may receive the data signal from the data driver DD. The drive power line Un may be connected to an external first power source ELVDD and may receive drive power from the first power source ELVDD.

The pixel PE may be provided at points where the gate wires GW cross the data wires DW, and may be connected to the gate wires GW and the data wires DW. The pixel PE may include thin film transistors and a capacitor connected to the first power source ELVDD, the gate wires GW, and the data wires DW, and an organic light emitting diode connected between the thin film transistors and a second power source ELVSS. The pixel PE may be selected when the scan signal is supplied through the scan line Sn. The pixel PE charges the voltage corresponding to the data signal through the data line Dm, and emits light with predetermined luminance corresponding to the charged voltage. The pixel PE will be described in detail below with reference to FIG. 2.

Figure 2:
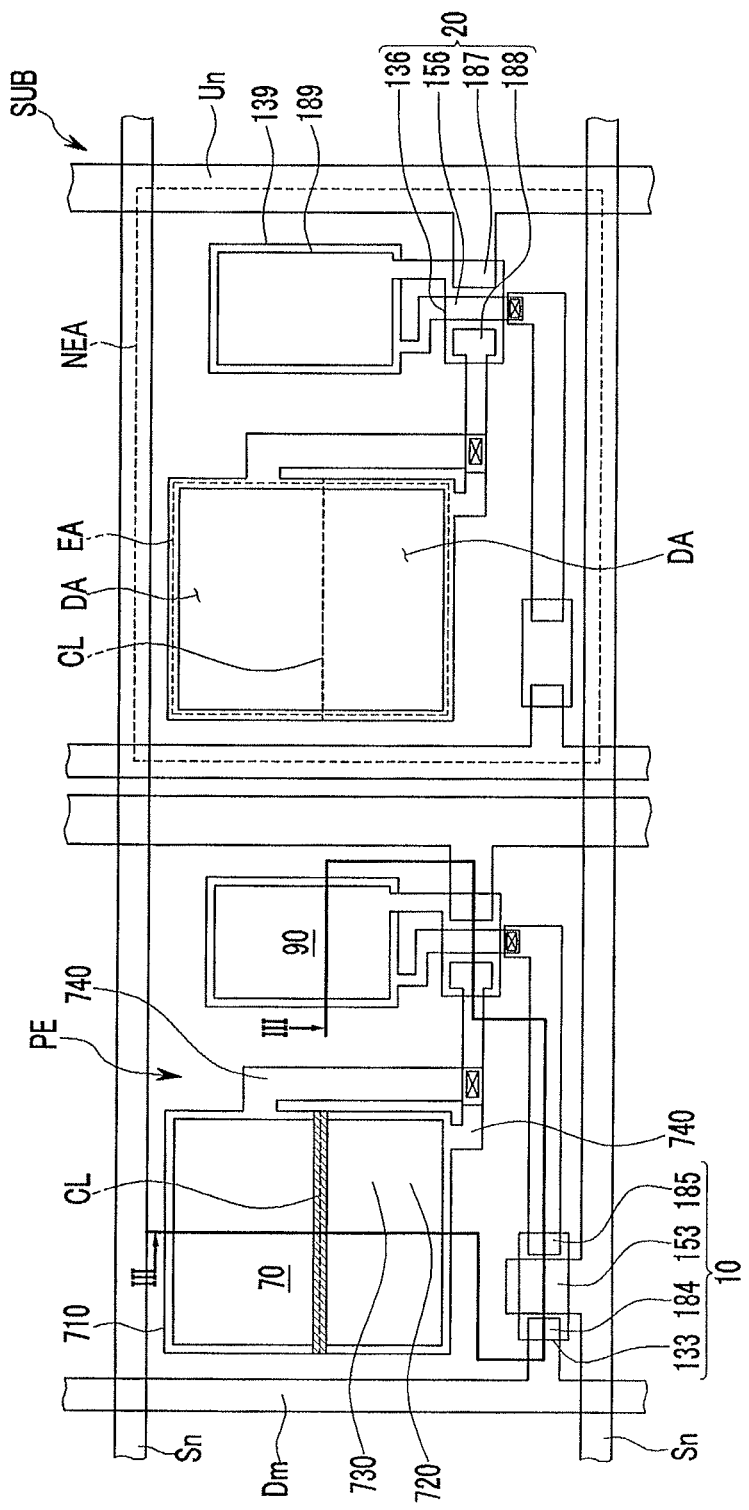
FIG. 2 illustrates a layout view of a portion A of FIG. 1.

FIG. 2 is a layout view of a part A of FIG. 1. As shown in FIG. 2, a pixel PE may have a 2Tr-1Cap structure in which an organic light emitting diode 70, two TFTs 10 and 20, and a capacitor 90 are disposed. However, in other implementations, the pixel PE may have a configuration in which at least three thin film transistors and at least two capacitors are disposed. Also, the pixel PE includes a light-emitting region EA where the organic emission layer 720 is positioned and a non-light-emitting region NEA neighboring the light-emitting region EA.

In detail, in the exemplary embodiment, the OLED display may include a switching thin film transistor 10 and a driving thin film transistor 20 for one pixel PE. The switching thin film transistor 10 and the driving thin film transistor 20 respectively include gate electrodes 153 and 156, active layers 133 and 136, source electrodes 184 and 187, and drain electrodes 185 and 188.

The source electrode 184 of the switching thin film transistor 10 may be connected to the data line Dm, and the gate electrode 153 of the switching thin film transistor 10 may be connected to the scan line Sn. A node may be formed between the drain electrode 185 of the switching thin film transistor 10 and the capacitor 90, so that the drain electrode 185 of the switching thin film transistor 10 may be connected to a first capacitor electrode 139 of the capacitor 90. Also, the drain electrode 185 of the switching thin film transistor 10 may be connected to the gate electrode 156 of the driving thin film transistor 20. The drive power line Un may be connected to the source electrode 187 of the driving thin film transistor 20, and the first electrode that is the anode of the organic light emitting diode 70 may be connected to the drain electrode 188.

The switching thin film transistor 10 may be used as a switch for selecting the pixel PE to emit light. When the switching thin film transistor 10 is instantly turned on, the capacitor 90 is instantly charged, and the amount of the charge is in proportion to the voltage applied from the data line Dm. While the switching thin film transistor 10 is turned off, a gate potential of the second thin film transistor 20 rises according to the potential charged in the capacitor 90. The driving thin film transistor 20 is turned on when the gate potential exceeds a threshold voltage. The voltage applied to the drive power line Un is applied to the organic light emitting diode 70 through the driving thin film transistor 20, and the organic light emitting diode 70 emits light.

The organic light emitting diode 70 may include a first electrode 710, which may be an anode functioning as a hole injection electrode, a second electrode 730, which may be a cathode functioning as an electron injection electrode, an organic emission layer 720 disposed between the first electrode and the second electrode, and a plurality of input terminals 740 connecting between the driving thin film transistor 20 and the first electrode 710.

The first electrode 710 may be positioned at the light-emitting region EA corresponding to the organic emission layer 720. A plurality of division regions DA divided according to a virtual cutting line CL divide the light-emitting region EA. The first electrode 710 may be a transmission electrode or a translucent electrode, and light emitted from the organic emission layer 720 may be recognized at the outside through the substrate SUB while passing through the first electrode 710.

The organic emission layer 720 may be positioned between the first electrode 710 and the second electrode 730, as a portion for emitting light, as described above.

The second electrode 730 may be disposed on the organic emission layer 720, as shown in FIG. 1, and may be formed throughout the entire surface of the OLED display with a plate shape. The second electrode 730 may be a light reflective electrode. Light emitted from the organic emission layer 720 may be reflected by the second electrode 730 and may be irradiated into the side of the first electrode 710, thereby being recognized outside through the substrate SUB. That is, the OLED display according to the exemplary embodiment may have a bottom light emitting structure.

A plurality of input terminals 740 may be positioned in a non-light-emitting region NEA and may respectively connect a plurality of division regions DA included in the first electrode 710 and the drain electrode 188 of the driving thin film transistor 20. The input terminals 740 may be integrally formed with the first electrode 710 and may be simultaneously formed with the first electrode 710. When forming the first electrode 710 through a MEMS process such as a photolithography process, a plurality of input terminals 740 may be formed such that the entire manufacturing process for forming the input terminal 740 may be simplified.

In other implementations, a plurality of input terminals may be formed with different materials from the first electrode 710. In this case, the first electrode 710 and a plurality of input terminals may be formed through different processes and may be positioned in different layers.

The first electrode 710 and the organic emission layer 720 of the left pixel PE of two pixels PE shown in FIG. 2 is cut by a laser according to the virtual cutting line CL. Accordingly, first electrode portions 710 and organic emission layer portions 720 may be created in each division region In the division regions DA of the first electrode 710 cut by the laser, the first electrode portion 710 and the second electrode 730 corresponding to one division region DA may be in a mutually short-circuited state, and the organic emission layer portion 720 positioned in the short-circuited division region DA does not emit light. The organic emission layer portion 720 positioned in the division region DA that is not short-circuited emits light. The virtual cutting line CL may cross the center of the entire light-emitting region EA to divide the entire light-emitting region EA into two division regions.

Next, referring to FIG. 3, the structure of the pixel PE cut by the laser according to the cutting line CL of the OLED display according to the exemplary embodiment will be described in detail according to the deposition sequence.

FIG. 3 is a cross-sectional view taken along the line III-III of FIG. 2.

As shown in FIG. 3, a buffer layer 120 may be formed on the substrate SUB. The buffer layer 120 may be formed as a single layer or as multiple layers including at least one insulating layer such as a silicon oxide layer and a silicon nitride layer. The buffer layer 120 may be formed by a chemical vapor deposition method or a physical vapor deposition method. The buffer layer 120 may be a light transmission insulation layer.

The buffer layer 120 may prevent the diffusion or penetration of moisture or impurities into the substrate SUB, may smooth the surface, and may control a heat transmission speed during a crystallization process for forming an active layer.

The buffer layer 120 may be omitted depending on the type of substrate SUB and process conditions.

Active layers 133 and 136 and a first capacitor electrode 139 may be formed on the buffer layer 120. As an example, the active layers 133 and 136 and the first capacitor electrode 139 may be formed by forming an amorphous silicon layer on the buffer layer 120, crystallizing the same, forming a polysilicon film, and patterning the polysilicon film. If desired, the first capacitor electrode 139 may be formed with a material that is different from the active layers 133 and 136.

A first insulation layer 140 may be formed on the active layers 133 and 136 and the first capacitor electrode 139. In detail, the first insulation layer 140 may be formed to cover the active layers 133 and 136 and the first capacitor electrode 139 on the buffer layer 120. The first insulation layer 140 is formed by including at least one of various insulating materials such as tetraethyl orthosilicate (TEOS), silicon nitride ($SiN_x$), and silicon oxide ($SiO_2$), for example. The first insulation layer 140 may be the light transmission insulation layer.

The buffer layer 120 and the first insulation layer 140 may also be positioned between the substrate SUB and the first electrode 710. In other implementations, only the light transmission insulation layer may be positioned between the substrate SUB and the first electrode 710.

Gate electrodes 153 and 156 and a first electrode 710 may be formed on the same layer as the scan lines S1 to Sn. Gate wires GW that are formed with the same material may be formed on the first insulation layer 140. The gate electrodes 153 and 156 may be formed on the active layers 133 and 136 so that they may overlap the channel regions 1333 and 1366 of the active layers 133 and 136. The active layers 133 and 136 may include the channel regions 1333 and 1366 to which no impurity is doped, and source regions 1334 and 1367 and drain regions 1335 and 1368 that are disposed on respective sides of the channel regions 1333 and 1366 and to which an impurity is doped. The gate electrodes 153 and 156 may prevent the impurity from being doped to the channel regions 1333 and 1366 while the impurity is doped to form the source regions 1334 and 1367 and the drain regions 1335 and 1368. Also, the impurity may be doped to the first capacitor electrode 139 while the impurity is doped to the source regions 1333 and 1366 and the drain region of the active layers 133 and 136.

Further, the gate electrodes 153 and 156 may be formed with double layers including a gate transparent layer and a gate metal layer that is formed on the gate transparent layer. The gate metal layer may be formed to include at least one of various metallic materials such as molybdenum (Mo), chromium (Cr), aluminum (Al), silver (Ag), titanium (Ti), tantalum (Ta), and tungsten (W). The gate transparent layer may include at least one transparent conductive material such as indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The first electrode 710 may be formed on the same layer with the same material as the gate transparent layers of the gate electrodes 153 and 156.

An inorganic insulation layer 160 may be formed on the gate electrodes 153 and 156. The inorganic insulation layer 160 may include at least one of a silicon oxide layer and a silicon nitride layer. The inorganic insulation layer 160 may be formed as a single layer made of silicon oxide or silicon nitride, or as multiple layers stacked with the silicon oxide layer and the silicon nitride layer. Also, the inorganic insulation layer 160 may include hydrogen. Particularly, the silicon nitride layer may easily include hydrogen according to the process conditions. The inorganic insulation layer 160 may support an annealing process by supplying hydrogen to the active layers 133 and 136 while the active layers 133 and 136 undergo the annealing process, in addition to the insulation function.

In other implementations, the inorganic insulation layer 160 may be omitted. That is, the second insulation layer 170 to be described may be formed on the gate electrodes 153 and 156.

Also, the inorganic insulation layer 160 is not formed on the first electrode 710. That is, the inorganic insulation layer 160 may be formed to expose the first electrode 710.

A second insulation layer 170 may be formed on the inorganic insulation layer 160. The second insulation layer 170 may be easily formed to be relatively thicker than the inorganic insulation layer 160. Therefore, the second insulation layer 170 may be formed to be thick enough to provide stable interlayer insulation. For example, the second insulation layer 170 may be formed to be substantially 3 μm thick.

The second insulation layer 170 may be thicker than the first insulation layer 140 so that the first insulation layer 140 is thinner than the second insulation layer 170.

Further, the second insulation layer 170 is not formed on the first electrode 710, just as the inorganic insulation layer 160 is not formed on the first electrode 710. That is, the second insulation layer 170 may be formed to reveal the first electrode 710.

A plurality of conductive wires 184, 185, 187, 188, and 189 may be formed on a same layer as the data lines D1 to Dm that form the data wires DW. The plurality of conductive wires 184, 185, 187, 188, and 189 may be formed with the same material on the second insulation layer 170. The conductive wires may include source electrodes 184 and 187, drain electrodes 185 and 188, and a second capacitor electrode 189. The conductive wires can further include a data line Dm and a drive power line Un.

Further, the conductive wires 184, 185, 187, 188, and 189 may be formed by including at least one of various suitable metallic materials in a like manner as the gate electrodes 153 and 156.

The source electrodes 184 and 187 and the drain electrodes 185 and 188 may contact the source regions 1334 and 1367 and the drain regions 1335 and 1368 of the active layers 133 and 136 through contact holes that are formed in the inorganic insulation layer 160 and the second insulation layer 170.

The second capacitor electrode 189 may be formed at the same position as the source electrodes 184 and 187 and the drain electrodes 185 and 188, as an example. Therefore, the second capacitor electrode 189 may be formed on the same layer as the gate electrodes 153 and 156.

A pixel defining layer 190 may be formed on the conductive wires 184, 185, 187, 188, and 189. The pixel defining layer 190 may be provided on the data lines D1 to Dm. The pixel defining layer 190 may include a pixel opening 195 for revealing a part of the first electrode 710. The pixel defining layer 190 may be formed of various suitable organic materials. For example, the pixel defining layer 190 may be patterned to be a photosensitive organic layer, and may be formed after being cured by heat or light.

An organic emission layer 720 is formed on the first electrode 710, and a second electrode 730 is formed on the organic emission layer 720. The first electrode 710, the organic emission layer 720, and the second electrode 730 form an organic light emitting diode 70. The pixel opening 195 of the second insulation layer 190 on which the first electrode 710, the organic emission layer 720, and the second electrode 730 are sequentially stacked becomes the light-emitting region EA of the organic light emitting diode 70. The non-light-emitting region NEA is positioned near the light-emitting region EA.

Among the division regions DA of the first electrode 710 cut by the laser, the first electrode portion 710 corresponding to the division region DA positioned at the right side in FIG. 3 is in the mutually short-circuited state with the second electrode 730. The organic emission layer portion 720 corresponding to the division region (DA) positioned at the right side does not emit light because of the short circuit of the first electrode portion 710 and the second electrode 730. The above short circuit of the first electrode 710 and the second electrode 730 may be generated by the presence of an undesired particle positioned at at least one of the first electrode 710, the second electrode 730, and the organic emission layer 720, or may be generated by an error of the manufacturing method. In contrast, the organic emission layer 720 corresponding to the division region DA positioned at the left side emits light because of the separation of the first electrode 710 and the second electrode 730.

The first electrode 710 of the OLED display of the first exemplary embodiment may include two division regions DA and two input terminals 740 respectively connecting the division regions DA and the driving thin film transistor 20. However, in other implementations, one first electrode of the OLED display may include three or more division regions DA and three and more input terminals respectively connecting the division regions DA and the driving thin film transistor 20.

The OLED display according to the exemplary embodiment may have a bottom light emitting structure. In other implementations, the OLED display may have a front light emitting structure. In this case, the first electrode may be formed as the light reflective electrode, and the second electrode may be formed as the light transmission electrode or the light translucent electrode.

As described above, in the OLED display according to the exemplary embodiment, a plurality of division regions DA of the first electrode 710 divided according to the virtual cutting line CL are connected to the driving thin film transistor 20 by a plurality of input terminals 740. Accordingly, even if an undesired particle is generated at at least one of the first electrode 710, the second electrode 730, and the organic emission layer 720 of any pixel PE in the manufacturing process, such that the first electrode 710 and the second electrode 730 are short-circuited, the organic emission layer portion 720 and the first electrode portion 710 of the short-circuited pixel PE may be cut by a laser.

Thereby, the organic emission layer portion 720 corresponding to the division region DA of the first electrode 710 where the short circuit is not generated may emit light. This repair process may function to improve the entire manufacturing yield. That is, in the manufacturing process, although the first electrode 710 and the second electrode 730 are short-circuited by an undesired particle, a plurality of division regions DA of the first electrode 710 may be cut from each other by the laser, so that the organic emission layer portion 720 corresponding to the division region DA of the first electrode portion 710 without the particle may emit light.

Next, referring to FIG. 4 to FIG. 7, the repairing method of the OLED display according to the second exemplary embodiment will be described.

Figure 4:
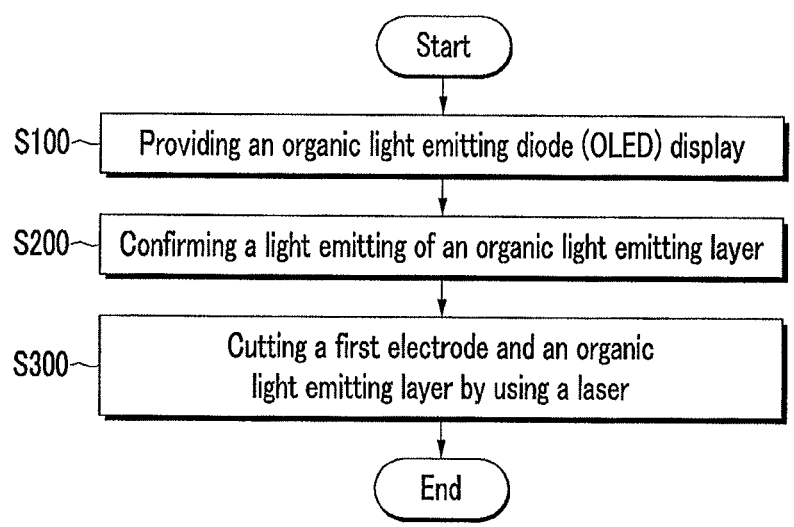
FIG. 4 illustrates a flowchart of a repairing method of an organic light emitting diode (OLED) display according to another exemplary embodiment.
Figure 5:
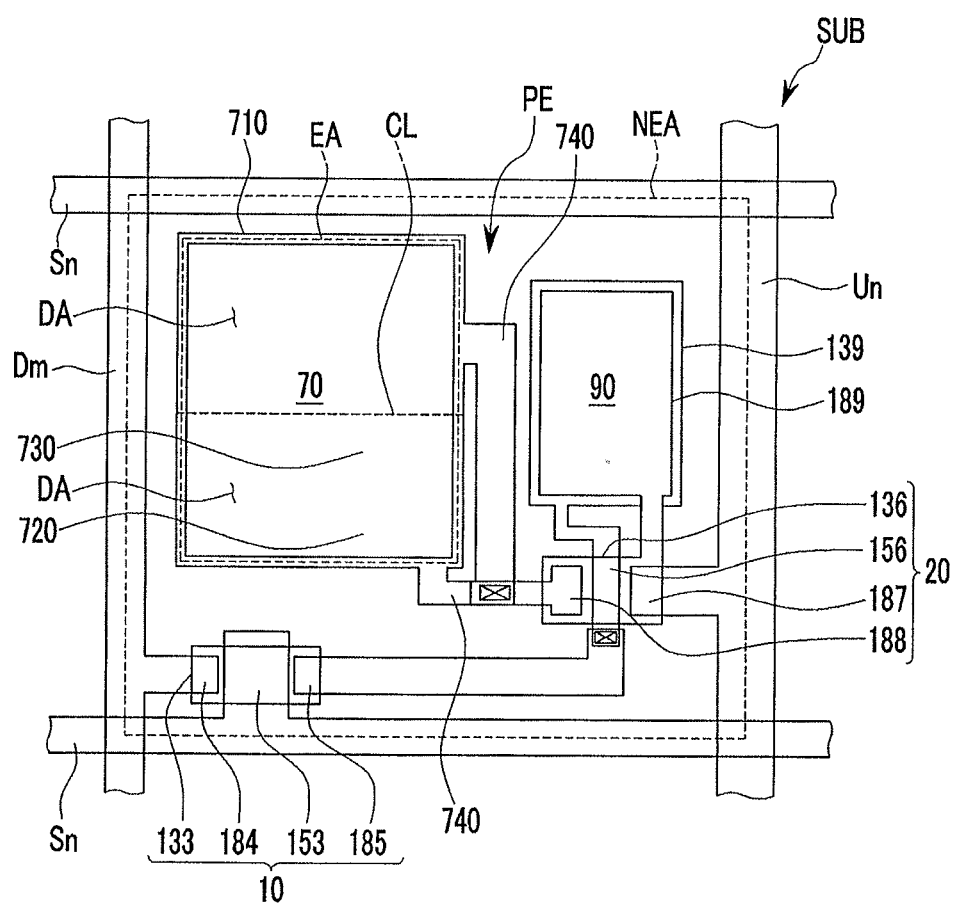
FIG. 5 to FIG. 7 illustrate views to explain a repairing method of an organic light emitting diode (OLED) display according to the exemplary embodiment of FIG. 4.
Figure 6:
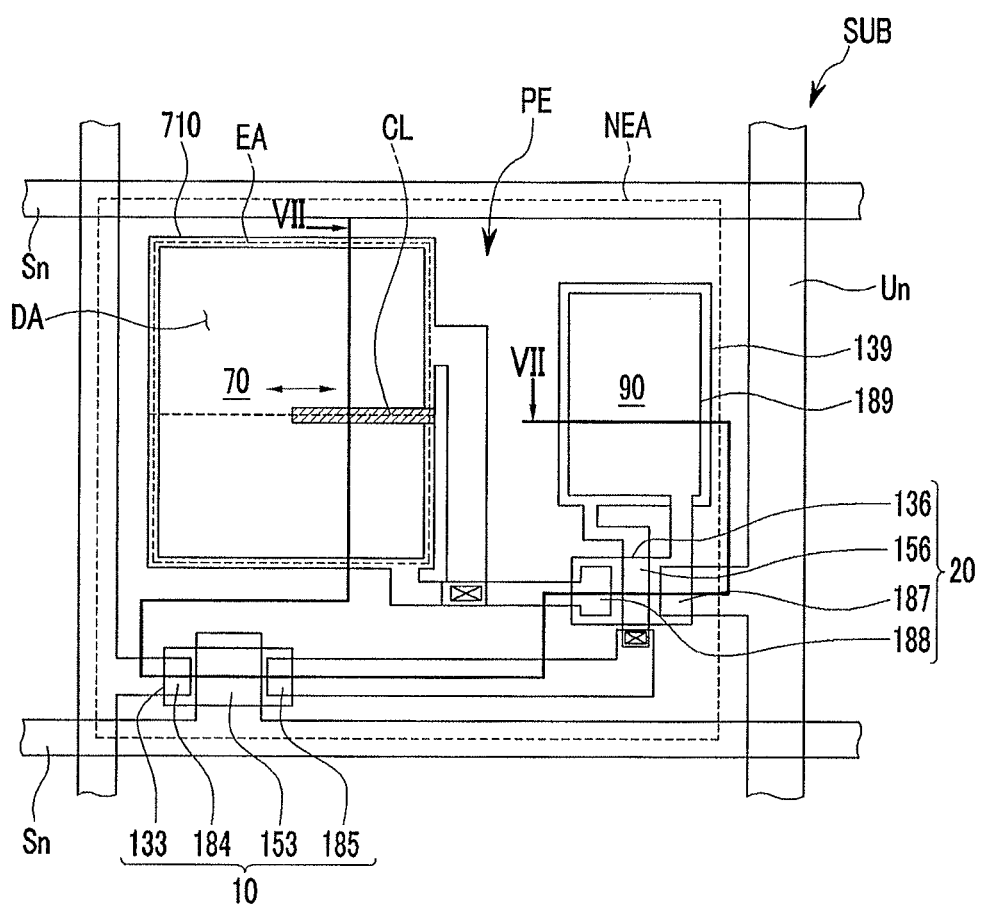
Figure 7:
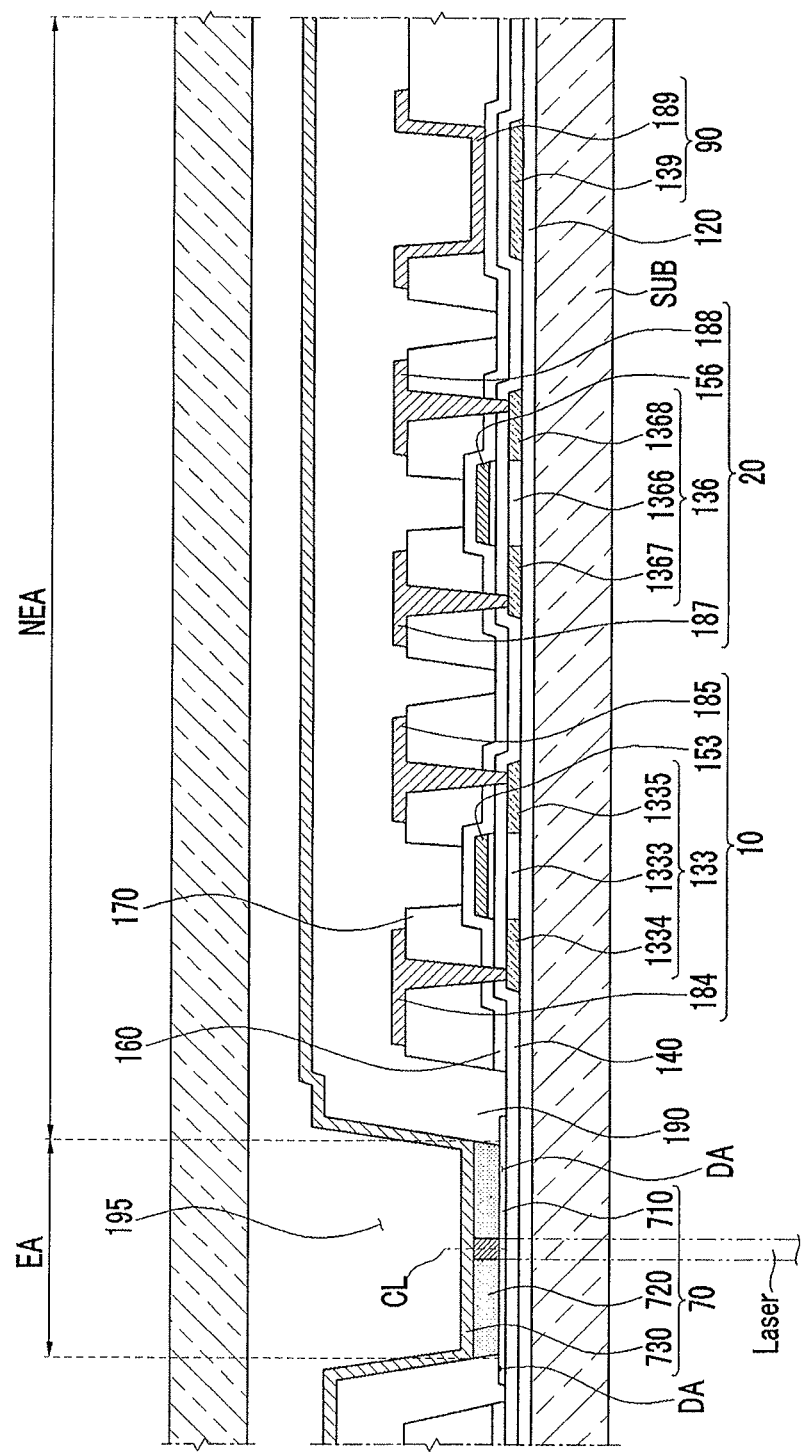

FIG. 4 is a flowchart of a repairing method of an organic light emitting diode OLED display according to another exemplary embodiment. FIG. 5 to FIG. 7 are views to explain a repairing method of the OLED display according to this exemplary embodiment. FIG. 7 is the cross-sectional view taken along the line VII-VII of FIG. 6.

As shown in FIG. 4 and FIG. 5, the above-described OLED display may be provided (S100).

In detail, the provided OLED display may be the OLED display in which the first electrode 710 is not cut according to the virtual cutting line CL for any pixel PE among the entire pixels PE.

Next, the light emitting of the organic emission layer 720 is confirmed (S200).

In detail, an emitting test to confirm the light emitting of the organic emission layer 720 is performed. In the emitting test to confirm the light emitting of the organic emission layer 720, a first power is supplied to the first electrode 710 through the driving thin film transistor 20 and a second power is supplied to the second electrode 730 for performing the emitting test. An organic emission layer 720 of a pixel PE in which a short circuit is generated between the first electrode 710 and the second electrode 730 does not emit light, and such a pixel PE is identified in the emitting test.

Next, as shown in FIG. 6 and FIG. 7, the first electrode 710 and the organic emission layer 720 of the pixel PE that does not emit light are cut by a laser (S300).

In detail, the laser is irradiated to the substrate SUB corresponding to the pixel PE including the organic emission layer 720 that does not emit light, in order to cut the first electrode 710 and the organic emission layer 720 according to the virtual cutting line CL. The division region DA of the first electrode 710 is cut using the laser, and the organic emission layer portion 720 corresponding to the division region DA of the first electrode 710 without a short circuit, among the entire organic emission layer 720 of the pixels PE that do not emit light, is then able to emit light. The laser may be an Nd:YAG UV laser and may have a wavelength range from 30 nm to 200 nm.

The repairing method of the OLED display according to this exemplary embodiment has been described as a method for repairing the OLED display that is a bottom light emitting structure, as described above. However, the repairing method of an OLED display according to another exemplary embodiment may repair an OLED display that is a front light emitting structure. In this case, the laser is irradiated at the side of the substrate positioned on the second electrode and may simultaneously cut the second electrode, the organic emission layer, and the first electrode according to the virtual cutting line.

As described above, in the repairing method of an OLED display according to the second exemplary embodiment, although the undesired particle may be generated at at least one of the first electrode 710, the second electrode 730, and organic emission layer 720 of any pixel PE in the manufacturing process such that the first electrode 710 and the second electrode 730 are short-circuited, the organic emission layer 720 and the first electrode 710 of the short-circuited pixel (PE) may be cut by a laser into a plurality of division regions DA of the first electrode 710 divided according to a virtual cutting line CL and connected to the driving thin film transistor 20 by a plurality of input terminals 740. Thereby, the organic emission layer portion 720 corresponding to the division region DA of the first electrode portion 710 in which a short circuit is not generated may easily emit light. This repair method may function to improve the entire manufacturing yield.

Also, in the repairing method of the OLED display according to this exemplary embodiment, the laser may irradiated to the substrate SUB on which the first electrode 710 is positioned and the first electrode 710 is divided to repair the pixel (PE) in which the short circuit is generated. Thereby, the repair process may be easily performed after a sealing process of sealing the OLED display. The entire manufacturing reliability of the OLED display may be improved, and simultaneously, defect generation of the OLED display may be suppressed by the repair process.

Also, the repairing method of the OLED display according to this exemplary embodiment simply cuts the first electrode 710 and the organic emission layer 720 according to the virtual cutting line CL crossing the light-emitting region (EA) including the organic emission layer 720 by laser so that the organic emission layer portion 720 corresponding to the division region DA of the first electrode 710 in which the short circuit is not generated may emit light, thereby providing simplification of the entire repair process. Accordingly, the manufacturing time and the manufacturing cost of the OLED display may be reduced.

The repairing method of the OLED display according to this exemplary embodiment may not repair the damage caused by the particle generating the short circuit between the first electrode 710 and the second electrode 730 and may not provide for testing for errors of the manufacturing process. The method for performing the repair of the OLED display may be carried out by simply cutting the organic emission layer 720 and the first electrode 710 according to the predetermined virtual cutting line (CL), thereby dividing the division region DA of the first electrode 710 corresponding to the organic emission layer 720 not emitting light such that at least a portion of the organic emission layer 720 that does not emit light becomes able to emit light, thereby realizing a method that reduces the time and the cost to test the reasons for generating the errors.

By way of summation and review, a general OLED display includes a first electrode, a second electrode positioned on the first electrode, and an organic emission layer positioned between the first electrode and the second electrode. However, in a manufacturing process of the conventional organic light emitting diode (OLED) display, when an undesired particle is positioned between the first electrode, the organic emission layer, and the second electrode, a short circuit may be formed between the first electrode and the second electrode such that the organic emission layer does not emit light.

Embodiments disclosed herein may provide an OLED display including an organic emission layer that emits light even though a first electrode and a second electrode are short-circuited by an undesired particle in a manufacturing process. Embodiments disclosed herein may also provide a repairing method of an OLED display.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. An organic light emitting diode (OLED) display including a light-emitting region including an organic emission layer and a non-light-emitting region neighboring the light-emitting region, the OLED display comprising:
    a first electrode in the light-emitting region and including a plurality of division regions divided along a virtual cutting line crossing the light-emitting region;
    an organic emission layer on the first electrode;
    a second electrode on the organic emission layer;
    a thin film transistor connected to the first electrode; and
    a plurality of input terminals extending from the first electrode, and connecting between each of the division regions and the thin film transistor;
    the first electrode and the organic emission layer being cut along the virtual cutting line such that each division region includes a first electrode portion of the first electrode and an organic emission layer portion of the organic emission layer.

2. The OLED display as claimed in claim 1, wherein the first electrode and the organic emission layer are cut by a laser.

3. The OLED display as claimed in claim 2, wherein one first electrode portion corresponding to one division region among the plurality of division regions in a short-circuited state with the second electrode.

4. The OLED display as claimed in claim 1, wherein the plurality of input terminals and the first electrode comprise same materials.

5. The OLED display as claimed in claim 1, wherein the plurality of input terminals and the first electrode are simultaneously formed.

6. The OLED display as claimed in claim 1, wherein the plurality of input terminals and the first electrode are formed of different materials.

7. The OLED display as claimed in claim 1, further comprising:
    an insulating layer between the first electrode and the plurality of input terminals; and
    contact holes formed in the insulating layer,
    wherein the first electrode and the plurality of input terminals are connected to each other through the contact holes.

8. The OLED display as claimed in claim 1, wherein the second electrode is a light reflective electrode.

9. A method of repairing an OLED display, the method comprising:
    providing an OLED display including a light-emitting region including an organic emission layer and a non-light-emitting region neighboring the light-emitting region, the OLED display including:
        a first electrode including a plurality of division regions divided along a virtual cutting line crossing the light-emitting region, the organic emission layer on the first electrode,
        a second electrode on the organic emission layer,
        a thin film transistor connected to the first electrode, and
        a plurality of input terminals extending from the first electrode and connecting the division regions and the thin film transistor; and
    cutting the first electrode and the organic emission layer along the virtual cutting line using a laser such that each division region includes a first electrode portion of the first electrode and an organic emission layer portion of the organic emission layer.

10. The method as claimed in claim 9, wherein cutting the first electrode and the organic emission layer is performed by irradiating the laser to the substrate.

11. The method as claimed in claim 9, wherein the laser is an Nd:YAG UV Laser and has a wavelength range of 30 nm to 200 nm.

* * * * *